(12) United States Patent
Sharma et al.

(10) Patent No.: US 12,684,866 B2
(45) Date of Patent: Jul. 14, 2026

(54) FIELD PLATED BIDIRECTIONAL HEMT STRUCTURE

(71) Applicant: GlobalFoundries U.S. Inc., Malta, NY (US)

(72) Inventors: Santosh Sharma, Austin, TX (US); Michael J. Zierak, Colchester, VT (US); Mark D. Levy, Williston, VT (US); Steven J. Bentley, Menands, NY (US)

(73) Assignee: GLOBALFOUNDRIES U.S. Inc, Malta, NY (US)

( * ) Notice: Subject to any disclaimer, the term of this patent is extended or adjusted under 35 U.S.C. 154(b) by 702 days.

(21) Appl. No.: 18/078,425

(22) Filed: Dec. 9, 2022

(65) Prior Publication Data

US 2024/0194680 A1    Jun. 13, 2024

(51) Int. Cl.
| | |
|---|---|
| *H10D 84/86* | (2025.01) |
| *H10D 30/01* | (2025.01) |
| *H10D 30/47* | (2025.01) |
| *H10D 62/85* | (2025.01) |
| *H10D 64/00* | (2025.01) |
| *H10D 84/05* | (2025.01) |

(52) U.S. Cl.
CPC .......... *H10D 84/86* (2025.01); *H10D 30/015* (2025.01); *H10D 30/475* (2025.01); *H10D 64/111* (2025.01); *H10D 84/05* (2025.01); *H10D 62/8503* (2025.01)

(58) Field of Classification Search
CPC .... H10D 84/86; H10D 30/015; H10D 30/475; H10D 64/111; H10D 84/05; H10D 62/8503
See application file for complete search history.

(56) References Cited

U.S. PATENT DOCUMENTS

| | | | |
|---|---|---|---|
| 8,168,486 | B2 | 5/2012 | Hebert |
| 8,283,699 | B2 | 10/2012 | Wu |
| 8,404,508 | B2 | 3/2013 | Lidow et al. |
| 8,604,512 | B2 | 12/2013 | Morita |

(Continued)

FOREIGN PATENT DOCUMENTS

| | | |
|---|---|---|
| CN | 103745993 A | 4/2014 |
| CN | 106486543 B | 12/2019 |

(Continued)

OTHER PUBLICATIONS

Notice of Preliminary Rejection dated Dec. 16, 2024 in KR Application No. 10-2023-0155084, 18 pages.

(Continued)

*Primary Examiner* — Eric W Jones
*Assistant Examiner* — Sammantha K Salaz
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to a bidirectional device, methods of manufacture and methods of operation. The structure includes: a first gate structure adjacent to a first source region; a second gate structure adjacent to a second source region; and field plates adjacent to the first gate structure, the second gate structure and a surface of an active layer of the first gate structure and the second gate structure.

14 Claims, 4 Drawing Sheets

(56)                References Cited

U.S. PATENT DOCUMENTS

| | | | |
|---|---|---|---|
| 9,130,570 | B2 | 9/2015 | Fornage et al. |
| 9,590,069 | B2 | 3/2017 | Dasgupta et al. |
| 2008/0308813 | A1 | 12/2008 | Suh et al. |
| 2012/0261720 | A1 | 10/2012 | Puglisi et al. |
| 2014/0264431 | A1 | 9/2014 | Lal |
| 2017/0229536 | A1 | 8/2017 | Stuber et al. |
| 2020/0227545 | A1 | 7/2020 | Then et al. |
| 2020/0357736 | A1* | 11/2020 | Akutsu ............... H10D 62/8503 |
| 2020/0381518 | A1 | 12/2020 | Otake |
| 2021/0050439 | A1 | 2/2021 | Prechtl et al. |
| 2021/0111254 | A1 | 4/2021 | Jones et al. |
| 2022/0093584 | A1 | 3/2022 | Lee et al. |
| 2022/0223699 | A1* | 7/2022 | Brun .................... H10D 30/475 |
| 2022/0262940 | A1 | 8/2022 | Coppens et al. |
| 2024/0128328 | A1 | 4/2024 | Zierak et al. |

FOREIGN PATENT DOCUMENTS

| | | |
|---|---|---|
| CN | 111129138 | 5/2020 |
| CN | 112490279 A | 3/2021 |
| KR | 1020220100481 A | 7/2022 |
| TW | 202228294 A | 7/2022 |
| TW | 202332052 A | 8/2023 |
| WO | 2021/076367 A2 | 4/2021 |

OTHER PUBLICATIONS

The Extended European Search Report and Opinion dated Jul. 10, 2024 in EP Application No. 23195277.1/ 4354511, 10 pages.
The Extended European Search Report and Opinion dated Jul. 22, 2024 in EP Application No. 23206288.5/ 4383244, 11 pages.
Foreign Office Action in TW Application No. 114103992 dated Mar. 21, 2025; 4 pages.
Carsten Kuring, "Novel monolithically integrated bidirectional GaN HEMT", 2018 IEEE Energy Conversion Congress and Exposition (ECCE), 2018, doi: 10.1109/ECCE.2018.8557741, 8 pages.
Foreign Office Action in TW Application No. 112143177 dated Sep. 3, 2024; 18 pages.
Final Office Action dated Sep. 10, 2025 in U.S. Appl. No. 17/964,356, 17 pages.
Non-Final Office Action in U.S. Appl. No. 17/964,356 dated May 6, 2025; 43 pages.

* cited by examiner

FIELD PLATED BIDIRECTIONAL HEMT STRUCTURE

This invention was made with government support under Contract #HQ0727790700 awarded by the Defense Micro-electronics Agency (DMEA). The government has certain rights in the invention.

The present disclosure relates to semiconductor structures and, more particularly, to a bidirectional device, methods of manufacture and methods of operation.

A high-electron-mobility transistor (HEMT) incorporates a junction between two materials with different band gaps (i.e. a heterojunction) as the channel, instead of a doped region (as is generally the case for a MOSFET). Commonly used material combinations are GaN or GaAs, although other materials can be used dependent on the application of the device.

HEMTs are able to operate at higher frequencies than ordinary transistors, up to millimeter wave frequencies. As the HEMTs are able to operate at higher frequencies, they can be used in high-frequency products such as cell phones, satellite television receivers, voltage converters, and radar equipment. For example, a HEMT may be used in satellite receivers and in low power amplifiers. In a bi-directional FET based on pGaN structure, operation of gate reliability and field reduction at the gate edge is very important compared to traditional unidirectional FETs. This is due to the fact that in operation the gate terminal can see high voltage.

SUMMARY

In an aspect of the disclosure, a structure comprises: a first gate structure adjacent to a first source region; a second gate structure adjacent to a second source region; and field plates adjacent to the first gate structure, the second gate structure and a surface of an active layer of the first gate structure and the second gate structure.

In an aspect of the disclosure, a structure comprises: a first gate structure on an active semiconductor material and which comprises a first source region; a second gate structure on the active semiconductor material and which comprises a second source region; a first contact to the first source region; a second contact to the second source region; and field plates surrounding the first contact and the second contact.

In an aspect of the disclosure, a method comprises: forming a first gate structure adjacent to a first source region; forming a second gate structure adjacent to a second source region; and forming field plates adjacent to the first gate structure, the second gate structure and a surface of an active layer of the first gate structure and the second gate structure.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a bidirectional device, methods of manufacture and methods of operation. More specifically, the present disclosure is directed to a field plated bidirectional HEMT structure. Advantageously, the field plated bidirectional HEMT structure provides improved gate reliability.

In embodiments, the bidirectional device includes two gate structures where either gate structure can assume high voltage. In embodiments, self-aligned field plates may be provided close to both gate structures and a surface of a semiconductor substrate comprising AlGaN/GaN. The gate structures and associated field plates completely enclose respective source terminals to avoid a gate crossing into an implanted isolation region, hence improving gate reliability.

The bidirectional device of the present disclosure can be manufactured in a number of ways using a number of different tools. In general, though, the methodologies and tools are used to form structures with dimensions in the micrometer and nanometer scale. The methodologies, i.e., technologies, employed to manufacture the bidirectional device of the present disclosure have been adopted from integrated circuit (IC) technology. For example, the structures are built on wafers and are realized in films of material patterned by photolithographic processes on the top of a wafer. In particular, the fabrication of the bidirectional device uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
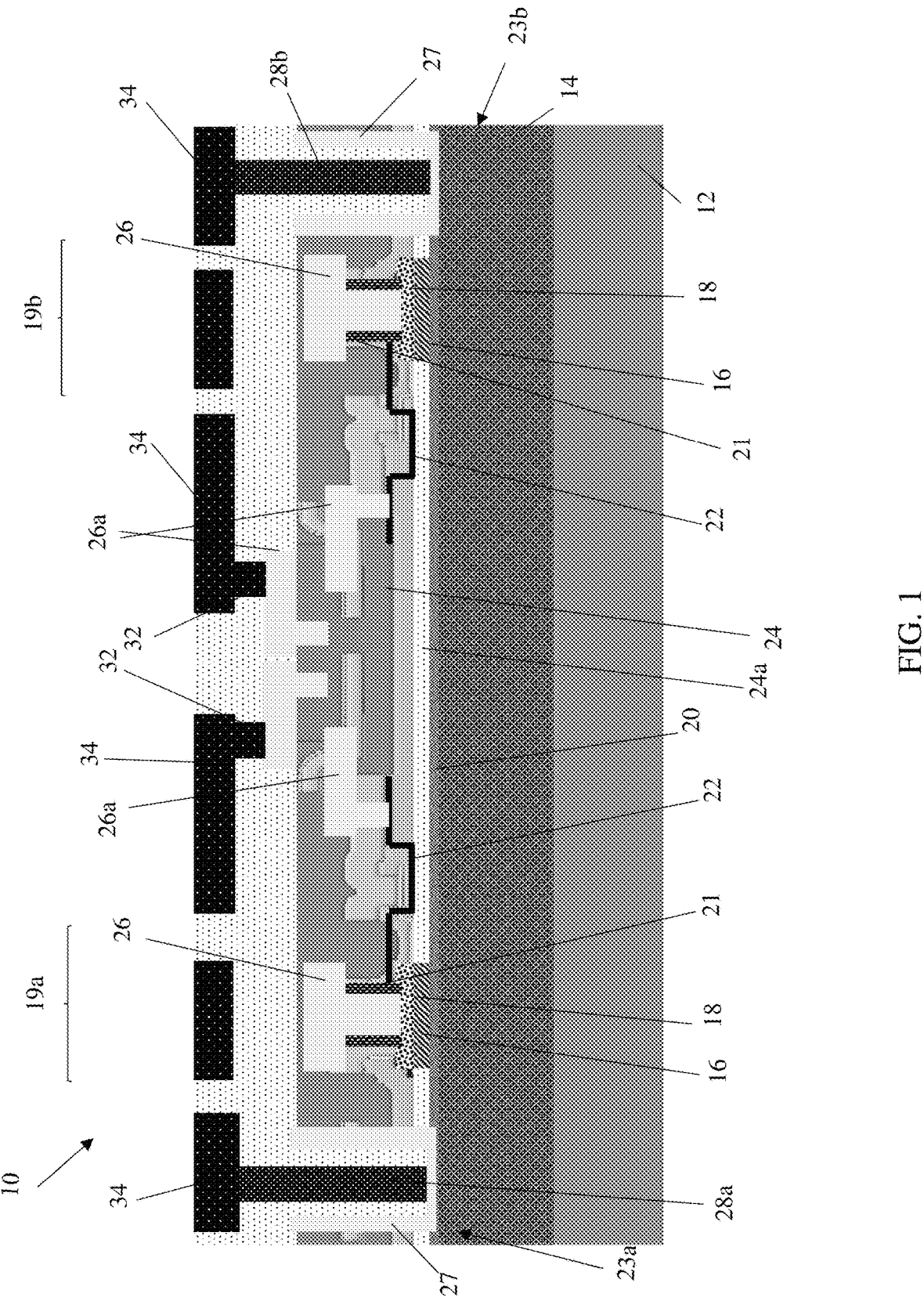
FIG. 1 shows a bidirectional HEMT device and respective fabrication processes in accordance with aspects of the present disclosure.

FIG. 1 shows a bidirectional HEMT device and respective fabrication processes in accordance with aspects of the present disclosure. More specifically, the structure 10 of FIG. 1 includes a semiconductor substrate 12 with a semiconductor material 14 on the semiconductor substrate 12. An active semiconductor layer 20 may be provided on the semiconductor material 14. The semiconductor substrate 12 may be composed of any suitable material including, but not limited to, Si, sapphire, SiGe, SiGeC, SiC, GaAs, GaN, InAs, InP, semiconductor on insulator (SOI) technology, Qromis' substrate technology (QST) or other III/V or II/VI compound semiconductors. In preferred embodiments, the semiconductor substrate 12 comprises p-type Si material with a suitable crystal orientation, e.g., (111). The semiconductor material 14 may be GaN as an example. In embodiments, the active semiconductor layer 20 may be GaN/AlGaN material. The active semiconductor layer 20 may act as a channel region for a HEMT device.

A semiconductor material 16 and conductive material 18 may be formed, e.g., deposited and patterned, on the active semiconductor layer 20. The combination of the semiconductor material 16 and the conductive material 18 may be patterned to comprise gate structures 19a, 19b. In embodiments, the semiconductor material 16 comprises, e.g., p-doped GaN, and the conductive material 18 may be, e.g., TiN. In embodiments, the semiconductor material 16 may be epitaxially grown on the active semiconductor layer 20 with an in-situ doping, e.g., p-type doping, as is known in the art. The conductive material 18 may be deposited by a conventional deposition method (e.g., chemical vapor deposition (CVD)), followed by conventional lithography and etching processes for both materials 16, 18. In embodiments, the conductive material 18 may be pulled back slightly.

Still referring to FIG. 1, a passivation layer (insulator material) 24a may be formed over the gate structures 19a, 19b and the active semiconductor layer 20. The passivation layer 24a may be a dielectric material, e.g., SiO₂. Field plates 22 may be formed partially over the active semiconductor layer 20 and in trenches formed in the passivation layer 24a. The field plates 22 may comprise TiN and may be self-aligned (due to the deposition and patterning processes) to protect edges of both of the gate structures 19a, 19b. Also, in embodiments, and as shown more specifically in FIG. 2, the field plates 22 may enclose respective source terminals (e.g., also referred to as ohmic contacts) 28a, 28b (and the source regions 23a, 23b) to avoid a gate crossing into an implanted isolation region, hence improving gate reliability. The field plates 22 may also be coupled to their respective sources 23a, 23b.

Referring still to FIG. 1, the field plates 22 may include a stepped feature, where a lower portion of the stepped feature is closer to the active semiconductor layer 20 than the upper portion of the stepped feature. In this way, the field plates 22 may be closer to the semiconductor material 14 and active semiconductor layer 20 within the source regions 23a, 23b of both of the gate structures 19a, 19b. As should now be understood, the gate structures 19a, 19b each include a separate source region 23a, 23b, which may be connected or electrically coupled to the field plates 22 through ohmic contacts and wiring layers as described in more detail herein.

In embodiments, the field plates 22 may physically be separated (e.g., electrically isolated) from a gate contact metal 26 contacting to the gate structures 19a, 19b. For example, sidewall spacers 21 formed on sidewalls of the gate contact metal 26 may electrically and physically isolate the gate contact metal 26 from an adjacent field plate 22. The gate contact metal 26 electrically connects (contacts) to the gate structures 19a, 19b and, more specifically, the conductive material 18.

An interlevel dielectric material 24, e.g., layers of oxide and/or nitride, may be formed over the field plates 22. The gate contact metal 26 may be, e.g., TiAl or TiN or Al or TaN, etc., formed by patterning of the interlevel dielectric material 24 to form a trench and which exposes the conductive material 18, e.g., TiN, followed by deposition of conductive material, e.g., TiN. In embodiments, the gate contact metal 26 and ohmic metals 26a, 27 for each of the source regions 23a, 23b may be the same metal materials formed in similar processes, e.g., conventional CMOS processes. Prior to forming the gate contact metal 26, the sidewall spacers 21 (e.g., nitride and/or oxide material) may be blanket deposited (e.g., lined) in a trench formed in the dielectric material 24 (and insulator material 24a) by a conventional deposition process, e.g., CVD, followed by conventional etching process.

Still referring to FIG. 1, ohmic contacts 28a, 28b may contact (e.g., electrically connect) to the underlying semiconductor material 14 (e.g., active semiconductor layer 20) by way of the ohmic contacts 27. It should be understood by those of skill in the art that the ohmic contacts 27 may be eliminated and that the ohmic contacts 28a, 28b may directly connect to the source regions 23a, 23b (e.g., semiconductor material 14). Back end of the line contacts (e.g., metal vias) 32, ohmic contacts 26a, and wiring structures 34 may be used to connect or couple the field plates 22 to the source regions 23a, 23b of both gate structures 19a, 19b.

In operation, when both the gate structures 19a, 19b are turned ON with respect to their sources 23a, 23b, it is now possible to have a current flow from source region 23a to source region 23b or from the source region 23b to source region 23a. Also, in this configuration it is now possible to expose the gate structure 19a or the gate structure 19b to high voltage. For example, the voltage of the gate structure 19a and the voltage of the source region 23a can be high (Vg1=Vs1=HV), when the voltage of the gate structure 19b and the voltage of the source region 23b are 0V (Vg2=Vs2=0V). In this state, the device can block voltage in the OFF state from the source region 23a to the source region 23b. Similarly, the voltage of the gate structure 19b and the voltage of the source region 23b can be high when the voltage of the gate structure 19a and the voltage of the source region 23a are 0V. In this state, the device can block voltage in the OFF state from the source region 23b to the source region 23a. Moreover, by having the field plates 22 closely coupled to the gate structures 19a, 19b, gate reliability can be improved due to improved shielding of the gate structures 19a, 19b.

Figure 2:
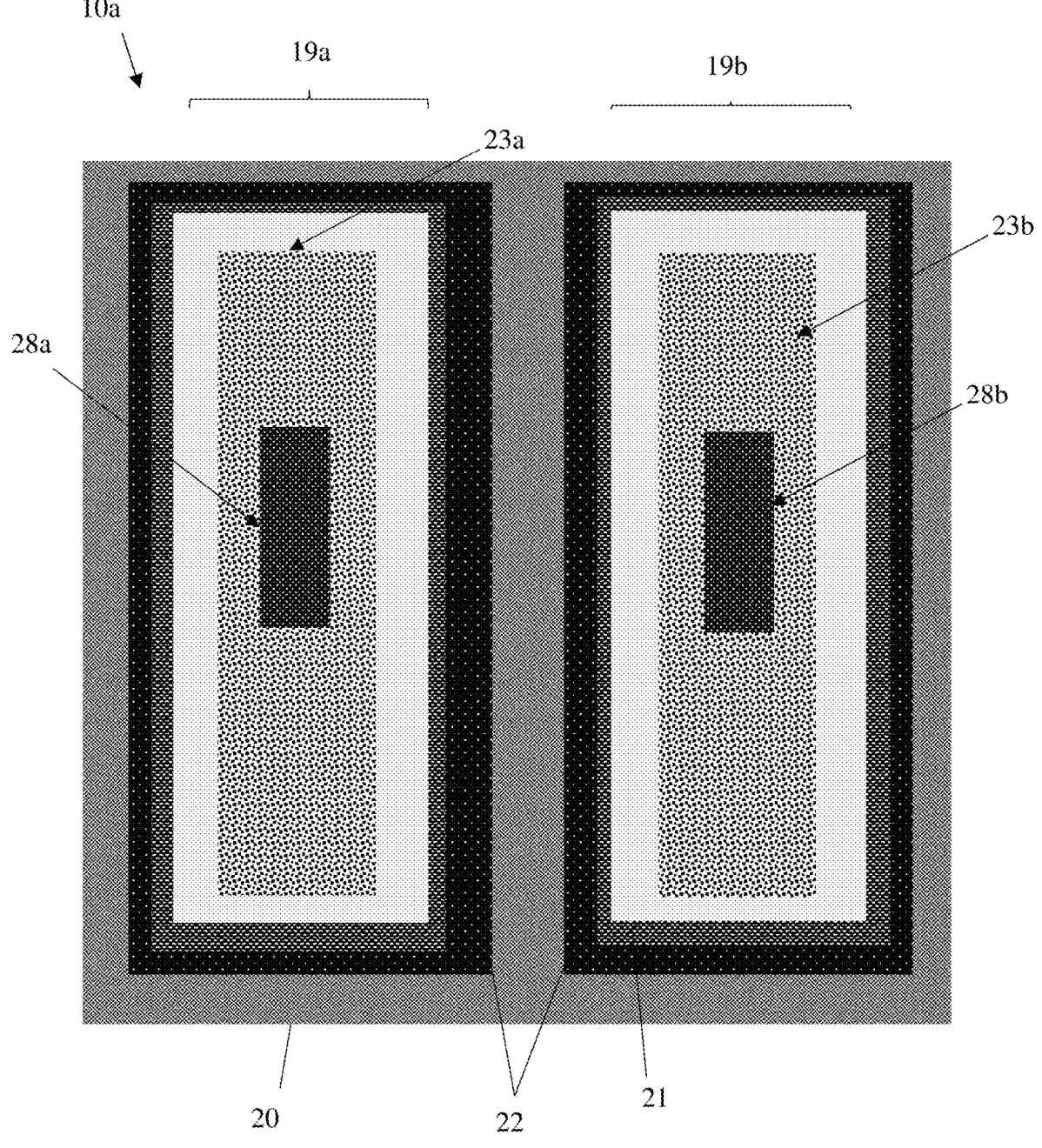
FIG. 2 shows a bidirectional HEMT device in accordance with additional aspects of the present disclosure.

FIG. 2 shows a bidirectional HEMT in accordance with aspects of the present disclosure. In this structure 10a, the gate structures 19a, 19b completely surround or enclose their respective source regions 23a, 23b. More specifically, pGaN gate structures 19a, 19b may be looped around respective source regions 23a, 23b and kept inside an active semiconductor layer (e.g., active region) 20 such that the pGaN gate structures 19a, 19b completely enclose their respective source regions 23a, 23b. Also, the field plates 22 completely surround and enclose both the source regions 23a, 23b and the gate structures 19a, 19b. The field plates 22 may be adjacent to the gate structures 19a, 19b and electrically coupled or connected to their respective source regions 23a, 23b. Moreover, the isolation implant, e.g., active semiconductor layer 20, is placed away from the gate structures 19a, 19b to avoid the gate structures from crossing the isolation implant for improved gate reliability.

Figure 3A:
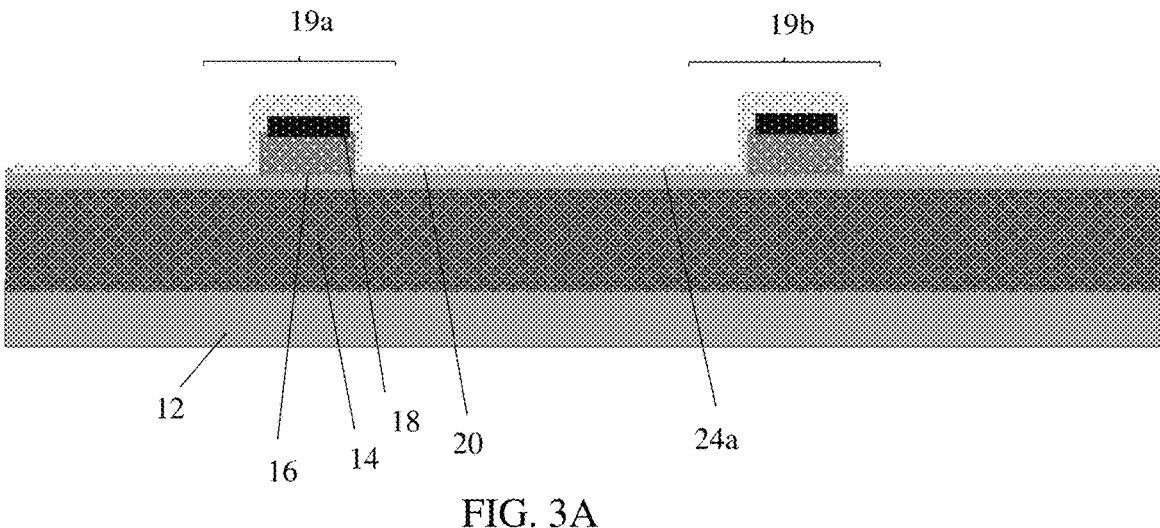
FIGS. 3A-3D show fabrication processes for manufacturing the device shown in FIG. 1 in accordance with aspects of the present disclosure.

FIGS. 3A-3D show fabrication processes for manufacturing the device shown in FIG. 1 in accordance with aspects of the present disclosure. In FIG. 3A, the semiconductor material 14 may be formed on the semiconductor substrate 12. The semiconductor material 14 may be deposited on the semiconductor substrate 12 using any conventional deposition method, e.g., CVD or epitaxial growth processes. An active semiconductor layer 20 (e.g., GaN and/or AlGaN) may be formed on the semiconductor material 14 by deposition or epitaxial growth processes.

Further, the gate structures 19a, 19b may be formed on the active semiconductor layer 20 by epitaxially growing the semiconductor material 16, e.g., GaN, on the active semiconductor layer 20. In embodiments, an in-situ doping (e.g., p-type dopant) may be used during the epitaxial growth process. The conductive material 18 may be formed on the semiconductor material 16, e.g., GaN, by a deposition process, e.g., CVD. The conductive material 18 and the semiconductor material 16, e.g., GaN, may be patterned using conventional lithography and etching processes as described herein to form the gate structures 19a, 19b. The insulator material 24a may be formed over the gate structure 19 using conventional deposition methods, e.g., CVD.

Figure 3B:
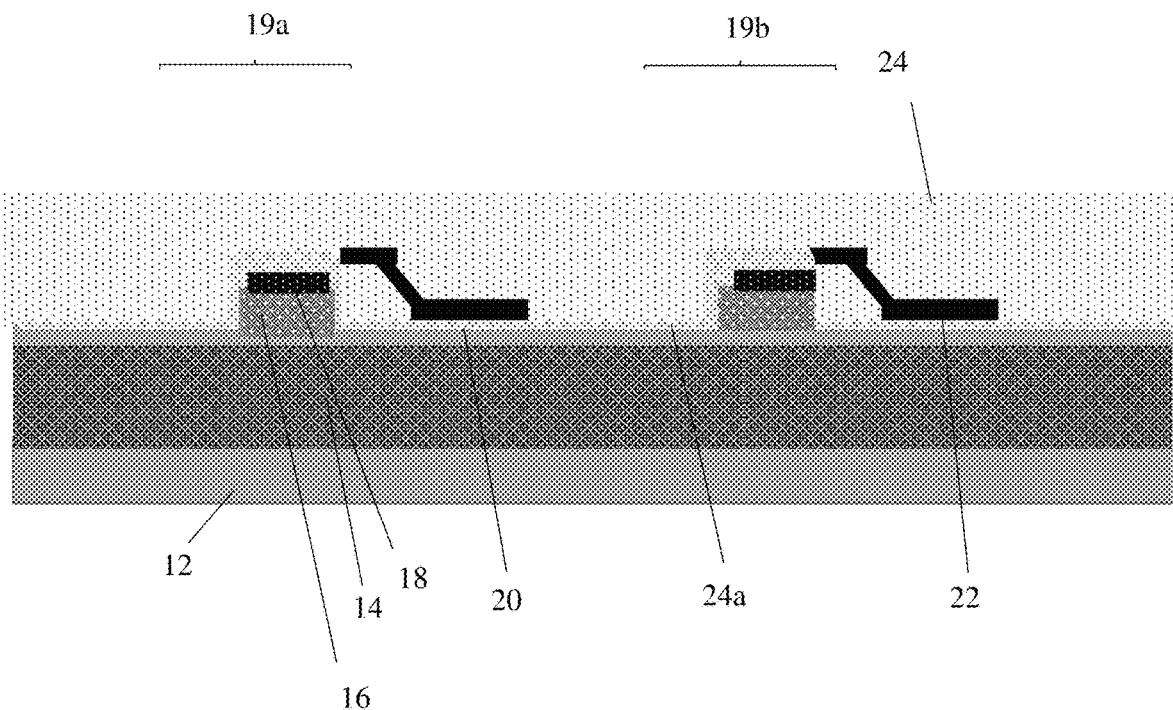

In FIG. 3B, dielectric material 24 may be deposited on the insulator material 24a, and patterned with the insulator material 24a prior to the formation of the field plates 22. In the patterning process, the dielectric material 24 and the insulator material 24a may be etched so that the field plates 22 may be deposited close to semiconductor material 14, e.g., active semiconductor layer 20, to form a stepped pattern. The field plates 22 may be blanket deposited over the gate structures 19a, 19b and the dielectric materials 24, 24a using conventional deposition methods, e.g., CVD. A conventional patterning process may be used to pattern the field plates 22 to form gaps in the field plates 22, and which surround the source contacts (e.g., ohmic contact for the source) 28a, 28b and the gate structures 19a, 19b. After the field plates 22 are patterned, additional dielectric material 24 may be deposited on the field plates 22.

Figure 3C:
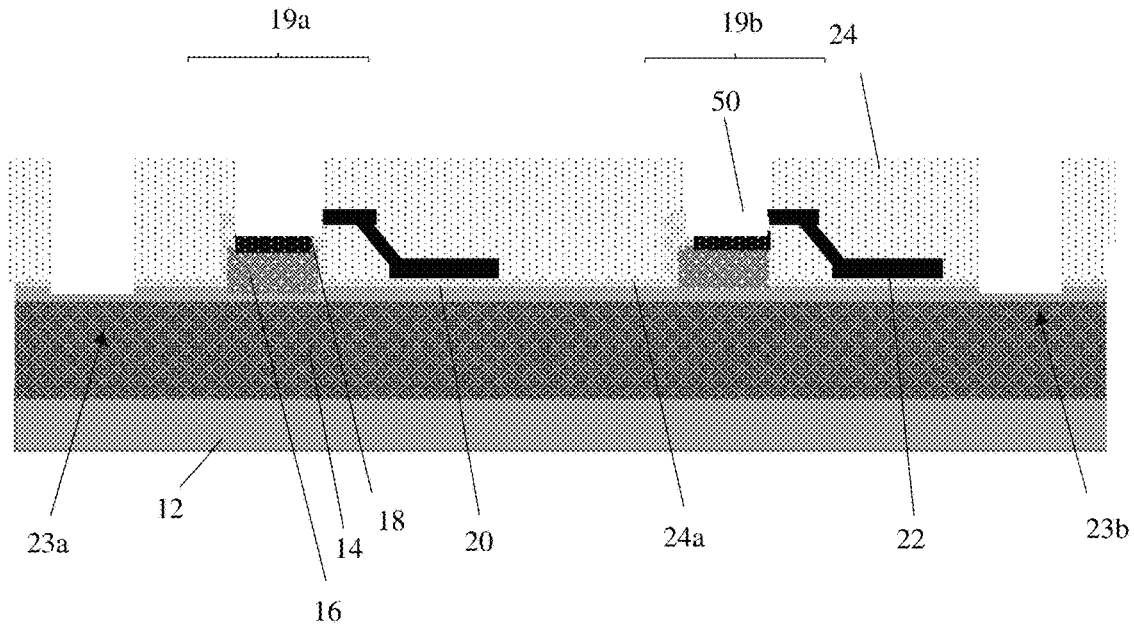

In FIG. 3C, trenches 50 may be formed in the dielectric material 24 (and any passivation material 24a over the gate structures), exposing the conductive material 18 of the gate structures 19a, 19b, in addition to exposing the semiconductor material 14 in the source regions 23a, 23b. The trenches 50 may be formed through the patterned field plates 22.

The trenches 50 may be formed by conventional lithography and etching methods known to those of skill in the art. For example, a resist formed over the dielectric material 24 is exposed to energy (light) and developed utilizing a conventional resist developer to form a pattern (opening). An etching process with a selective chemistry, e.g., reactive ion etching (RIE), will be used to transfer the pattern into the dielectric material 24 (and other materials, e.g., active semiconductor layer 20) depending on the depth form one or more trenches 50.

Figure 3D:
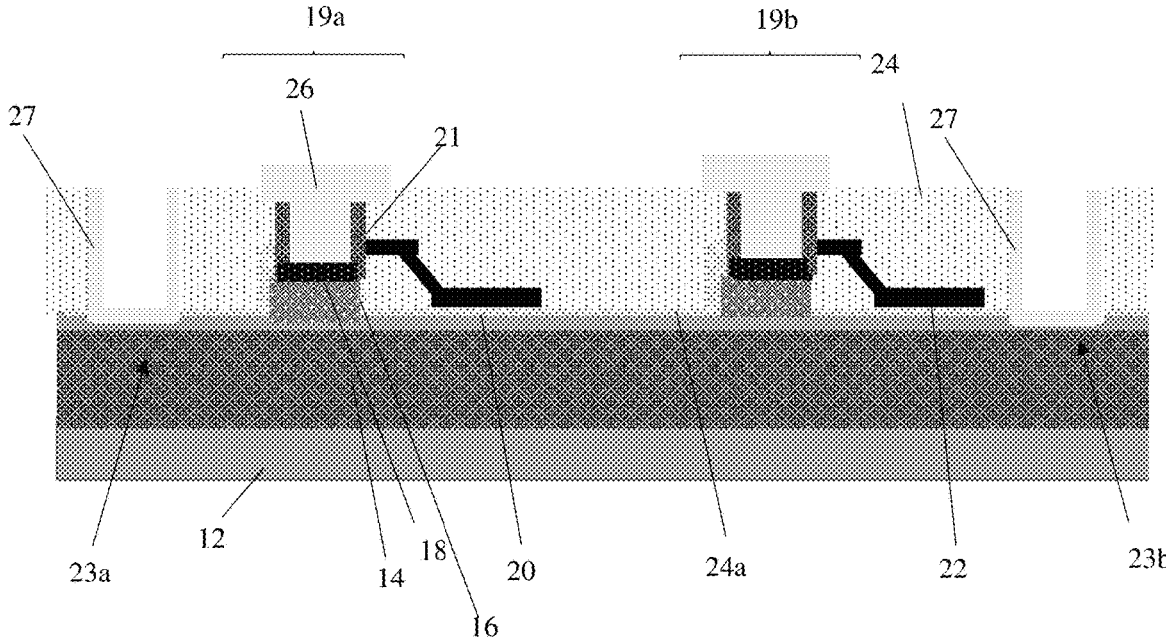

As shown in FIG. 3D, the sidewall spacers 21 are formed in the trenches 50 above the gate structures 19a, 19b. The sidewall spacers 21 can be formed by a deposition nitride and/or oxide by a CVD process, followed by an anisotropic etching process. The gate contact metal 26 may be formed over the sidewall spacers 21. The ohmic contacts 27 may also be formed in the trenches 50, in contact with the semiconductor material 14 (e.g., active semiconductor layer 20) in the source regions 23a, 23b. In embodiments, the gate contact metal 26 and the ohmic contacts 27 may be formed in the same deposition process, followed by a chemical mechanical polishing (CMP) process to remove any excessive conductive material on the dielectric material 24.

Referring back to FIG. 1, an interlevel dielectric material 30 may be formed over the interlevel dielectric material 24 using conventional deposition methods, e.g., CVD. The back end of the line contacts 32 and the ohmic contacts 28a, 28b may be formed using conventional lithography, etching and deposition processes as is known in the art. The ohmic contacts 28a, 28b may comprise, e.g., TiAl or TiN. The metal wirings 34 to the source regions 23a, 23b may be formed by back end of the line metal processes (e.g., TiN liner with tungsten fill) as is known in the art such that no further explanation is required for a complete understanding of the present disclosure.

The bidirectional device can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a first gate structure adjacent to a first source region;
a first source contact connecting to the first source region;
a second gate structure adjacent to a second source region;
a second source contact connecting to the second source region;
a first field plate which surrounds the first gate structure, the first source region and the first source contact; and
a second field plate which surrounds the second gate structure, the second source region and the second source contact,
wherein the first field plate and the second field plate are above a surface of an active semiconductor layer, and the active semiconductor layer acts as a channel region for the first gate structure and the second gate structure.

2. The structure of claim 1, wherein the first gate structure and the second gate structure comprise bidirectional gate structures.

3. The structure of claim 2, wherein the active semiconductor layer comprises AlGaN/GaN material.

4. The structure of claim 1, wherein the first field plate completely surrounds the first source region and the second field plate completely surrounds the second source region.

5. The structure of claim 1, further comprising a first gate contact extending to the first gate structure and a second gate contact extending to the second gate structure, and a first sidewall spacer on sidewalls of the first gate contact and a second sidewall spacer on sidewalls of the second gate contact, wherein the first and second field plates abut a respective sidewall spacer such that the first and second field plates are electrically and physically isolated from the first and second-gate contacts, respectively.

6. The structure of claim 1, wherein the first field plate is electrically isolated from a first gate contact connecting to the first gate structure and the second field plate is electrically isolated from a second gate contact connecting to the second gate structure.

7. A structure comprising:
a first gate structure on an active semiconductor material and which comprises a first source region;
a first gate contact metal extending to the first gate structure;

a first sidewall spacer surrounding the first gate contact metal;

a second gate structure on the active semiconductor material and which comprises a second source region;

a second gate contact metal extending to the second gate structure a second sidewall spacer surrounding the second gate contact metal;

a first source contact connecting to the first source region;

a second source contact connecting to the second source region; and a first field plate surrounding the first source contact and the first gate structure;

a second field plate surrounding the second source contact and the second gate structure, wherein the first field plate further abut to the first sidewall spacer of the first gate structure and the second field plate further abuts to the second sidewall spacer of the second gate structure such that the first and second field plates are electrically and physically isolated from the first gate contact metal and the second gate contact metal, respectively.

8. The structure of claim 7, wherein the first gate structure and the second gate structure comprise GaN gate structures.

9. The structure of claim 8, wherein the first and second gate contact metals extend to the first gate structure and the second gate structure, respectively.

10. The structure of claim 7, wherein the first gate structure and the second gate structure comprise bidirectional gate structures.

11. The structure of claim 7, wherein the first field plate individually-surrounds the first source region and the second field plate surrounds the second source region.

12. The structure of claim 11, wherein the first field plate completely surrounds the first source contact and the second field plate completely surrounds the second source contact.

13. The structure of claim 7, wherein the first field plate is aligned with the first gate structure and the second field plate is aligned with the second gate structure.

14. A method comprising:

forming a first gate structure adjacent to a first source region;

forming a first source contact connecting to the first source region;

forming a second gate structure adjacent to a second source region;

forming a second source contact connecting to the second source region;

forming a first field plates-plate which each of surrounds the first gate structure, the first source region and the first source contact, and forming a second field plate which surrounds the second gate structure, the second source region and the second source contact, wherein the first field plate and the second field plate are above a surface of an active semiconductor layer, and the active semiconductor layer comprises an active region which acts as a channel region for the first gate structure and the second gate structure.

* * * * *